United States Patent [19]

Robin et al.

[11] 4,053,888
[45] Oct. 11, 1977

[54] ARRANGEMENT FOR MEASURING THE LAG BETWEEN TWO TIMED SIGNALS BY ELECTRONIC CORRELATION

[75] Inventors: Léon Robin; Thaddeus Hawkes, both of Paris, France

[73] Assignee: Thomson-CSF, Paris, France

[21] Appl. No.: 729,799

[22] Filed: Oct. 5, 1976

[30] Foreign Application Priority Data

Oct. 10, 1975 France .............................. 75.31123

[51] Int. Cl.² .............................................. G01S 9/08
[52] U.S. Cl. ............................ 343/13 R; 343/100 CL
[58] Field of Search ........................ 343/100 CL, 13 R

[56] References Cited

U.S. PATENT DOCUMENTS

| | | | |
|---|---|---|---|
| 3,208,065 | 9/1965 | Gutleber et al. | 343/100 CL X |
| 3,329,956 | 7/1967 | Caspers | 343/100 CL X |
| 3,450,869 | 6/1969 | Wiley et al. | 343/100 CL X |
| 3,518,415 | 6/1970 | Gutleber | 343/13 R X |
| 3,573,819 | 4/1971 | Mason et al. | 343/13 R X |
| 3,721,986 | 3/1973 | Kramer | 343/100 CL X |
| 3,906,213 | 9/1975 | Meriaux et al. | 343/100 CL X |

*Primary Examiner*—Malcolm F. Hubler
*Attorney, Agent, or Firm*—Karl F. Ross

[57] ABSTRACT

An arrangement for measuring by correlation the lag produced by the transmission of a coded signal through a delaying medium and which permits a high signal-to-noise ratio and high accuracy. The received coded signal is applied to two correlators followed by a subtractor to form a discriminator circuit utilized to lock the frequency of a generator which provides two reference coded signal utilized respectively for correlation and to form an automatic tracking loop. The lag measurement is obtained by state-decoding of the transmission coded signal and of one of the reference coded signal and by pulse counting at a period sub-multiple of the bit period.

8 Claims, 9 Drawing Figures

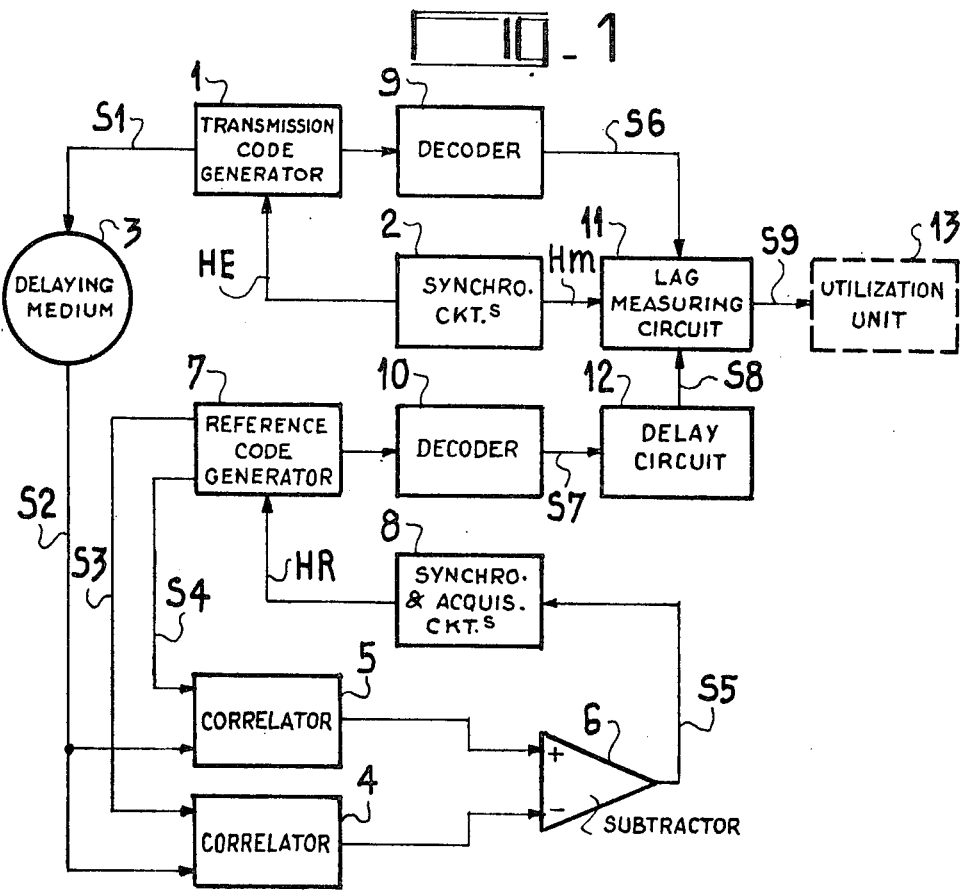
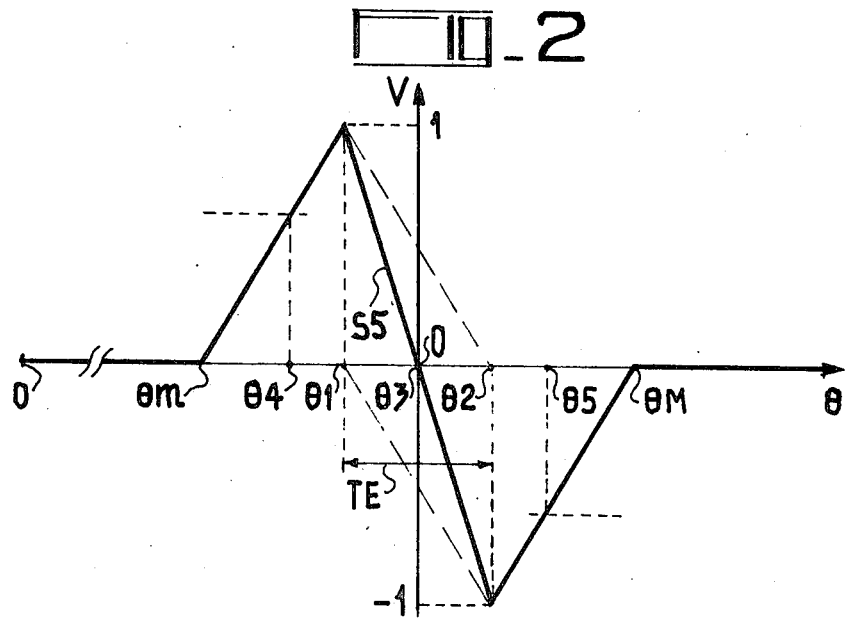

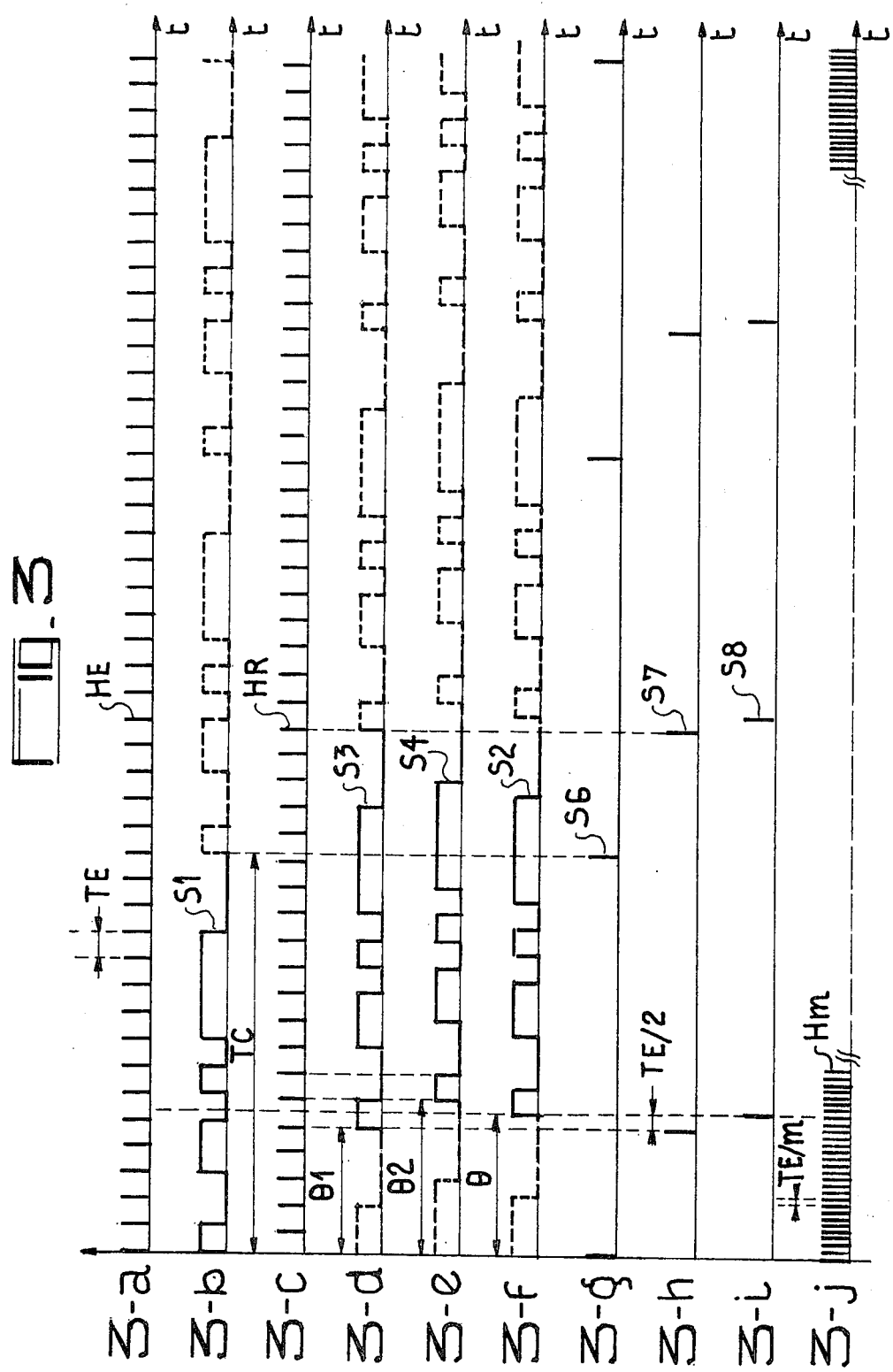

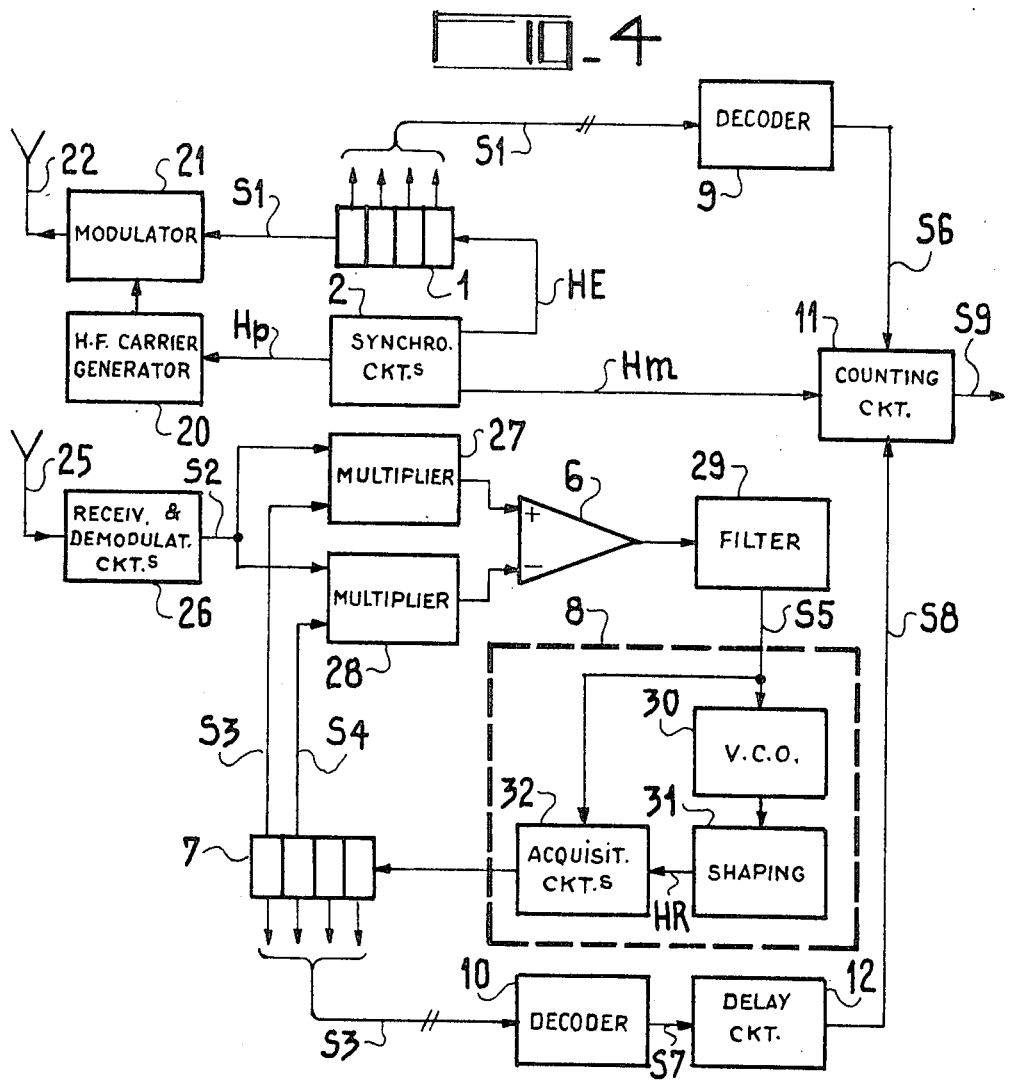
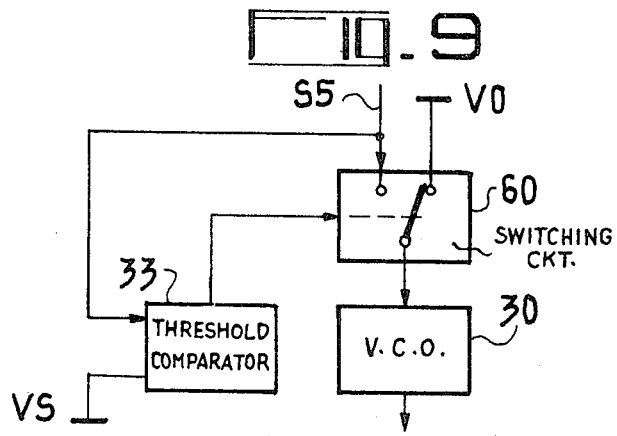

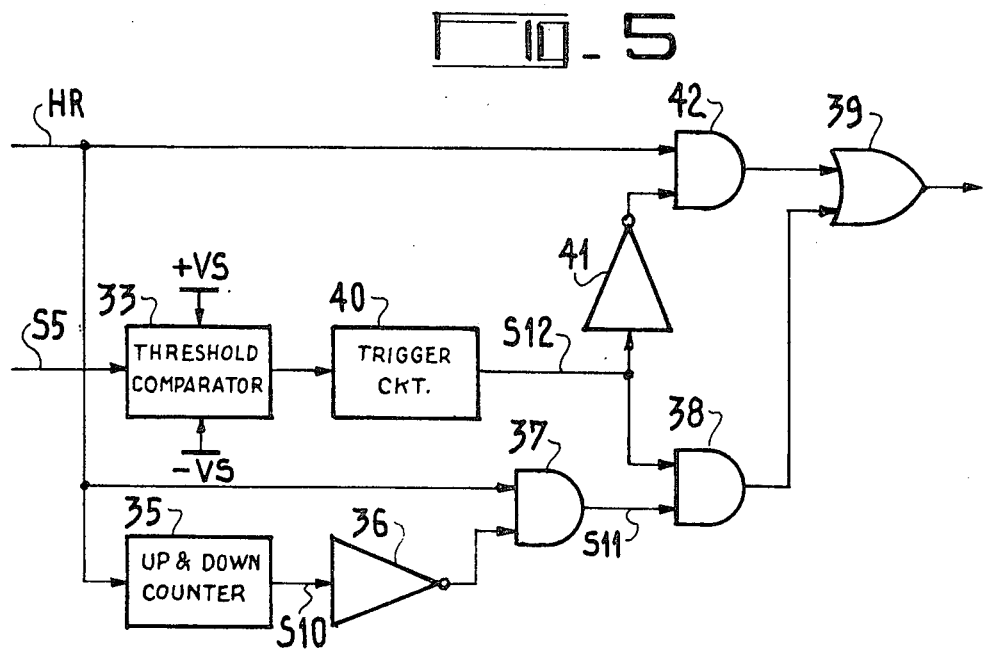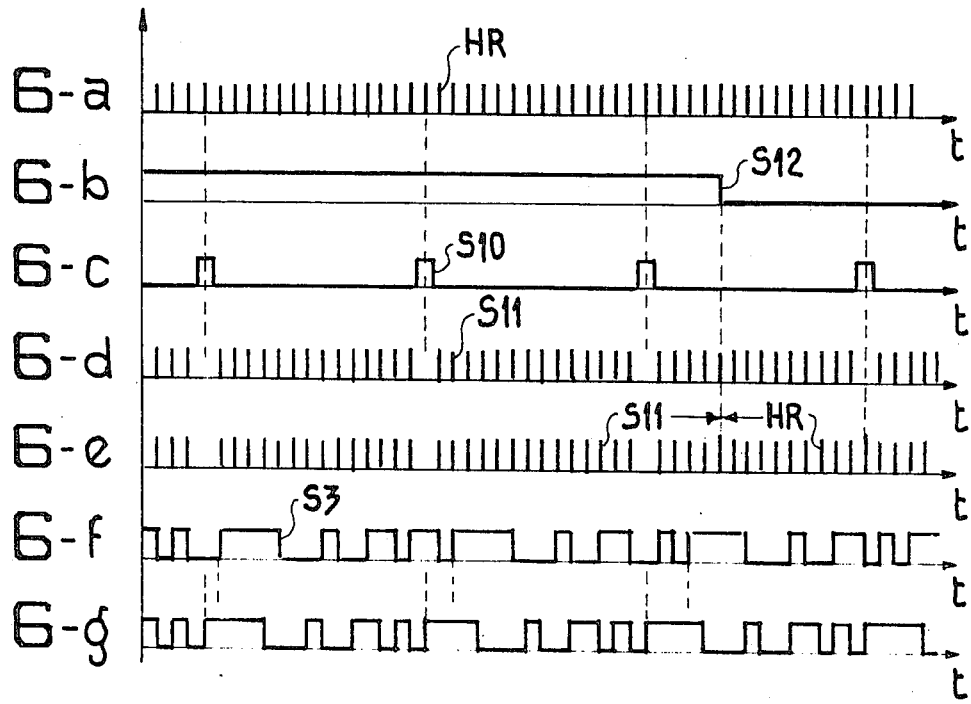

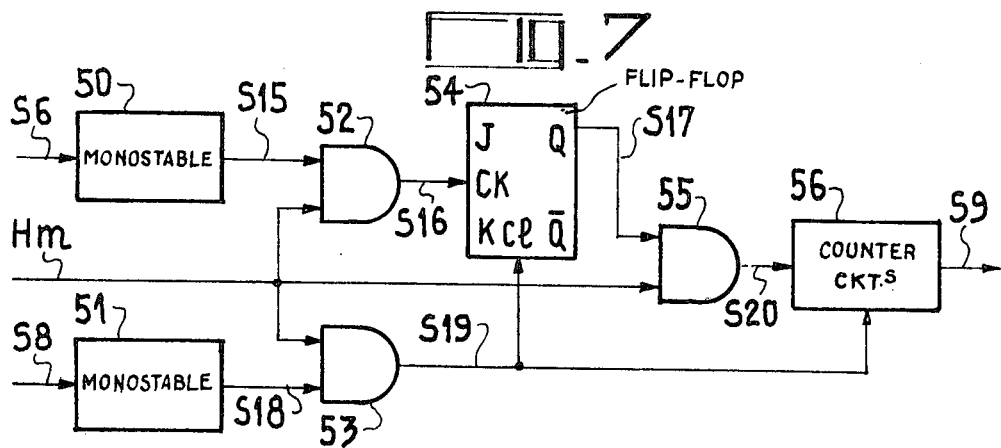
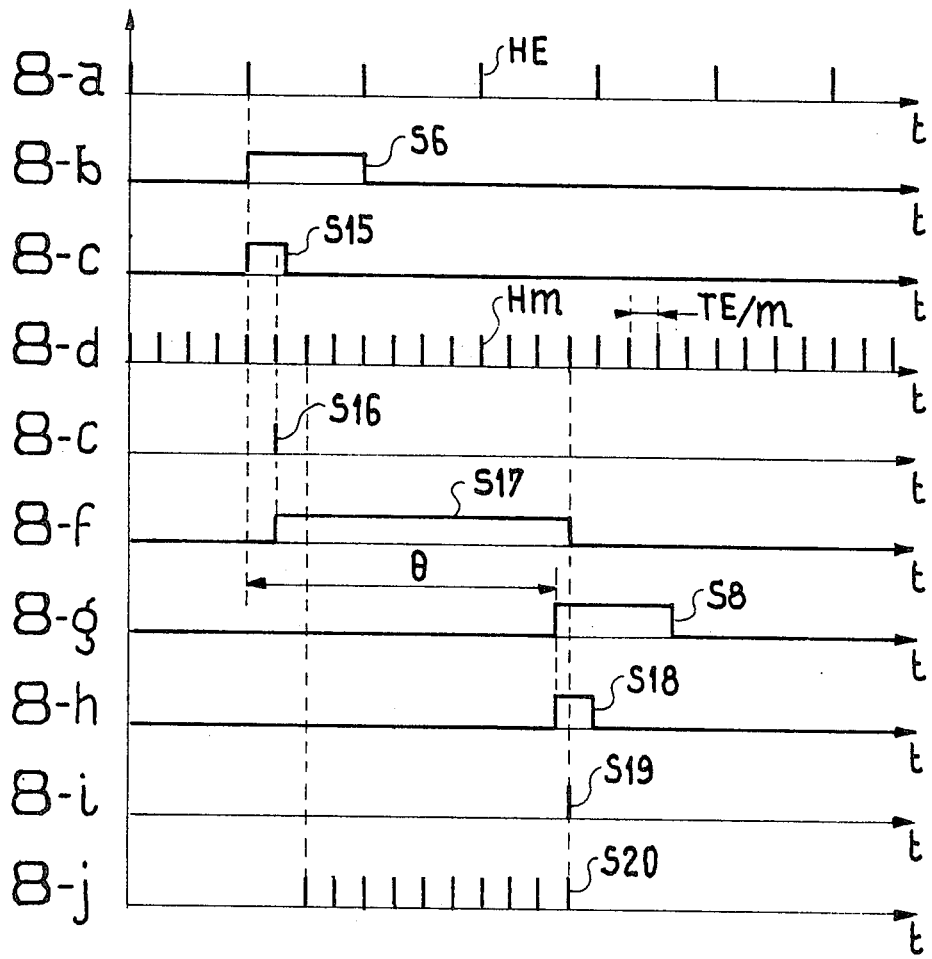

ARRANGEMENT FOR MEASURING THE LAG BETWEEN TWO TIMED SIGNALS BY ELECTRONIC CORRELATION

The present invention relates to an arrangement for measuring the lag between two timed signals by electronic correlation.

Correlation enables the degree of resemblence or similarity between two functions of the same parameter to be measured, the parameter concerned in the present case being the variable represented by time $t$. The resulting measurement (the correlation factor) is characteristic of the point-by-point resemblance between the two functions in a given relative temporal state. This factor is obtained by calculating the product of the two functions and then performing integration within predetermined limits and averaging the result to give a mean product. The variation in this factor represents the variation in the degree of resemblance; it is found by varying the difference in time between the function and it forms the correlation function.

If the functions or signals to be correlated are called A $(t)$ and B $(t)$, the correlation factor can be written $A(t) \cdot B(t)$. If $\theta 1$ is the anticipated lag of $A(t)$ with respect to a predetermined time origin which is taken as zero and if $\theta$ is the initially unknown lag of $B(t)$ with respect to this origin, the correlation factor becomes $A(t + \theta 1) \cdot B(t + \theta)$.

To measure the lag between the two signals, auto-correlation conditions are generally brought into use, that is to say the signal corresponding to the first function, termed the reference function $A(t + \theta 1)$ is caused to be identical to, or at least present in, the second signal, which represents the second function termed the function to be correlated $B(t + \theta)$, except for the difference in time between $\theta 1$ and $\theta$. In addition, the correlation is preferably performed with signals of the coded-pulse type to enable an ideal auto-correlation function to be produced which consists of a high amplitude triangular spike practically free of side lobes. Such a function may in particular be produced by auto-correlating a cyclic pseudo-random code.

Use is found for such arrangements in particular electromagnetic detection systems for measuring the range of an object, with signal $A(t)$ representing the wave emitted by a radar system or an optical range finder and signal $B(t + \theta)$ representing the received echo signal returned by the object. The received signal contains signal $A(t)$ with a time lag and mixed in with noise and it is correlated with a local reference signal $A(t + \theta 1)$ which is generally produced by delaying the transmitted signal $A(t)$.

In detecting the signal from the correlator, i.e. the correlation factor, allowance must be made for interference signals due to noise and, should it so happen, to side-lobe signals of the correlation function. The resultant misdetections or false alarms are generally eliminated by means of a comparison with a predetermined threshold level. Combining the correlative with a threshold comparator enables a limited range of lag to be measured.

Various correlation techniques have been used, as dictated by the intended application and/or the accuracy of measurement required in terms of value and sign. Thus, for example, measurements covering a wide time span may be made by using a plurality of correlators.

In certain of these techniques, a discriminator circuit is used which comprise two correlation channels determined in such a way that the correlation functions have a common area of overlap in which the measurements are made; the correlation outputs are applied to a subtractor circuit to produce a difference signal which varies in a substantially linear fashion in the area in question and which is zero at the centre of this area.

A correlation arrangement according to the invention uses such a discriminating circuit and processes particularly to obtain an accurate measurement of lag. It enables a high signal to noise ratio to be obtained and it is particularly suitable for tracking a moving target by radio-electrical or optical range-finding.

According to the invention, there is provided an arrangement for measuring the lag between two timed signals by electronic correlation, comprising: a first circuit for generating a numerical coded signal, means for transmitting the said coded signal through a transmission medium, means for receiving the coded signal after said transmission, a discriminator circuit of the type comprising two correlation circuits for correlating the coded signal received with respective ones of two reference coded signals reproducing said numerical code and relatively displaced in time in such a way that their respective auto-correlation functions partially overlap to form a common range of lag measurement and a differential circuit for providing a signal representing the difference between the correlation outputs, a first synchronising circuit for synchronising with a first clock signal the said first generator circuit, a second generator circuit for producing the said two reference signals, a second synchronising circuit for synchronising the said second generator circuit using a synchronising signal whose frequency is locked to the amplitude of the said difference signal and lag measuring means comprising two state-decoding circuits having inputs connected to the said generator circuits respectively and outputs connected to a measuring circuit, said state decoding circuits providing each a pulse signal, the time interval separating said pulse signals corresponding to the lag to be measured, the said first synchronising circuit providing a second clock signal for measurement purposes whose period is a sub-multiple of the period of said first clock signal to enable the said measuring circuit to count pulses.

The invention will now be further described with reference to the accompanying drawings in which:

FIG. 1 shows a simplified block diagram of an arrangement according to the invention, FIGS. 2 and 3 show operating waveforms, FIGS. 4 to 8 show circuit diagrams and operating waveforms relating to an embodiment of the measuring arrangement, FIG. 9 shows a diagram of part of a modified embodiment.

The simplified diagram of FIG. 1 shows the essential means of the measuring arrangement and the principle of operation is illustrated with the assistance of the curves and waveforms in FIGS. 2 and 3.

The measuring arrangement comprises means for transmitting a signal which is coded according to a predetermined numerical code, correlating reception means, and means for measuring the difference in time or lag between the transmitted signal and the received signal. The lag is produced by the transmission of the signal through a delaying medium which is generally formed by a propagation medium.

The transmitted signal is assumed to have been coded, preferably in a successively repeated binary code of the pseudo-random type in view of the advantages which this type of coding offers for processing by correlation. It is understood that this is not to be considered as limiting the invention. Waveforms 3b, 3d, 3e and 3f show an example of a pseudo-random code which is fifteen bits long.

The transmission means are represented by a code-generating circuit 1 synchronised by a synchronising circuit 2. Circuit 2 supplies a clock signal HE (FIG. 3a) whose constant period TE determines the bit width of the code and the breadth of the auto-correlation spike at half its height. The coded transmission signal S1 (FIG. 3b) is transmitted into a propagation medium 3, where it becomes subject to a delay $\theta$ to be measured.

The received signal S2 (FIG. 3f) from medium 3 is applied to a discriminator circuit made up of two correlators 4 and 5 and a differential circuit 6. A first correlator 4 receives a first reference signal S3 (FIG. 3d) which is delayed by an amount $\theta 1$ with respect to the transmitted signal S1 and the second correlator 5 receives a second reference signal S4 (FIG. 3e) which is delayed by an amount $\theta 2$ with respect to signal S1; the amount $\theta 2$ being equal to $\theta 1$ plus one clock-period or bit duration TE. The auto-correlation function resulting from such a circuit is represented in FIG. 2 which shows the linear variation obtained over the lag range $\theta 1$ to $\theta 2$, with the value of the difference signal S5 from substractor 6 being zero at the point $\theta 3$ representing the centre of this range.

The reference signals S3 and S4 are obtained from a second code-generator circuit 7 which is synchronised by a second synchronising circuit 8. Circuit 8 provides a clock signal HR (FIG. 3c) whose period is locked to the amplitude of the difference signal S5. The type of coding produced by generating circuit 7 is the same as the transmission coding, that is to say a fifteen-bit pseudo-random code in the case of the example shown (FIGS. 3d,3e). The tracking loop thus formed enables the point of stable operation $\theta 3$ to be automatically shifted and brought into coincidence with the value $\theta$ for the lag of the received signal S2. At this time, bit period HR is synchronous with the period of the received signal S2. It being assumed that propagation through medium 3 does not affect parameter TE, the bit period at this time is the same as that TE at transmission. Referring to FIG. 2, it can be seen that an automatic adjustment takes place when the size $\theta$ of the lag to be measured falls within the range of linear variation between $\theta 1$ and $\theta 2$. When the value $\theta$ to be measured differs from $\theta 3$ by an amount greater than $\pm TE/2$ but is still within the overall auto-correlation range lying between the minimum value $\theta m$ and the maximum value $\theta M$ (FIG. 2), the tracking loop is still able to adjust but its ability to do so is a function of the noise level; it is generally able to adjust when the excursions are fairly close to the values $\theta 1$ and $\theta 2$, that is to say when signal S5 is of sufficiently great amplitude. Finally, if value $\theta$ lies outside the overal range $\theta m$ to $\theta M$, the tracking loop is inoperative. It is therefore necessary to arrange for a preliminary acqusistion phase when the difference between the value $\theta$ to be measured and the central part $\theta 1$ to $\theta 2$ of the range is too great to allow the automatic tracking to come into operation. Acquisition is brought about by shifting the S-shaped auto-correlation curve S5 along the lag axis until the difference has been reduced sufficiently to allow the tracking loop to automatically operate and to bring value $\theta 3$ into coincidence with the value $\theta$ to be measured. The synchronising circuit 8 is arranged to be capable of carrying out the preliminary acquisition phase when necessary.

The lag $\theta$ is measured by measuring the interval between the time at which any bit of the coded signal S1 is transmitted and the time at which the same bit is received in coded signal S2. It will be appreciated that the concept of successively repeated codes prevents the maximum range of lag measurement from exceeding the total length TC of the code (FIG. 3b). The measuring means employed consist of two decoding circuits 9 and 10 and a measuring circuit 11. A first decoding circuit 9 produces, from the coded signal S1, a signal S6 (FIG. 3g) formed by a pulse, each time the transmitted code reaches a predetermined state to which a predetermined transmitted bit corresponds. Similarly, the second decoding circuit 10 produces from signal S3 a signal S7 (FIG. 3h) formed by a pulse each time coded signal S3 reaches this same state, which state, after the tracking loop had adjusted, corresponds to the reception of the same bit in the case of a signal S2. Once the adjustment has taken place, the correspondence is exact except for the difference of TE/2 between signals S3 and S2. To make allowance for this difference, a delay of TE/2 is introduced by means of a delay element 12 for example, which is inserted in the output connection of decoding circuit 10. Circuit 11 measures the time interval separating the respective pulses of signals S6 and S8 (FIG. 3i), the latter being the result of the signal S7 delayed by circuit 12. The measurement is accurately made by counting the pulses of a clock signal Hm (FIG 3j) whose period TE/m is a sub-multiple of period TE and which, like clock signal HE, is supplied by synchronising circuit 1. The measurement information S9 at the output of circuit 11 forms the useful signal, which is intended for an ancillary user device represented by block 13. The use made of signal S9 is determined by the type of operation planned and it may be used for display purposes or for computer processing, for example.

An embodiment of the measuring arrangement shown in FIG. 4 will now be described. The pseudo-random code generators 1 and 7 are produced in a known way from a shift register having a feed-back loop and a modulo 2 addition circuit. The number $n$ of stages in the registers determines the maximum length $N = 2^n - 1$ of the code. In the case of the example envisaged in FIG. 3b, the code contains $N = 15$ bits and the register $n = 4$ stages. The signals S3 and S4 representing the reference codes to be correlated are obtained from the respective outputs of two successive stages of register 7.

The transmitter contains a pilot circuit 20 which generates a high frequency carrier wave. This wave is applied to a modulating and transmitting circuit 21 which receives a modulating signal formed by the coded transmission signal S1. In the case of coherent modulation, the pilot circuit may be synchronised as represented by a clock signal Hp whose period TE/p is a submultiple of that of clock signal HE. Synchronising circuit 2 contains an oscillator of frequency p/TE, frequency dividing circuits, and shaping circuits to supply pulse trains forming signals Hp, Hm and HE. A radiating device 22 is responsible for Hertzian transmission of the modulated carrier wave.

Conversely, the receiver includes a reception aerial 25 and reception and demodulating circuits 26 to extract the coded signal S2. The correlators are formed by two multiplication circuits 27 and 28 which are situated upstream of the subtracting circuit 6 and by a single integrating circuit 29, such as a filter circuit, connected to the output of circuit 6. Signal S5 is taken from the output of filter circuit 29, whose pass-band makes allowance for the duration TC and the bit width TE of the code, for the accuracy required, and for the maximum time taken by the loop to lock on. Circuit 6 may be an amplifier of the differential type.

Synchronising circuit 8 includes an oscillator 30 of the voltage controlled type whose frequency can be adjusted in a predetermined range centered on the transmission frequency 1/TE. From the sine wave produced by oscillator 30, a shaping circuit 31 produces a pulse train forming the synchronising signal HR which is transmitted to generator 7 during the tracking phase. The acquisition phase, if there is one, is the responsibility of circuits 32 which may be produced as described with reference to FIGS. 5 and 6.

The decoding circuits 9 and 10 receive the respective signals S1 and S3 to be decoded from the parallel outputs of the corresponding registers 1 and 7 and may each consists of a logic statedecoding circuit which produces a pulse when the appropriate binary state exists.

FIG. 6 shows operating wave forms for the acquisition circuits shown in FIG. 5. In a comparison circuit 33, the difference signal S5 is compared with two predetermined threshold levels + VS and − VS, so as to take into account the polarity of signal S5 (FIG. 2) which may be either positive or negative, as well as the means noise level. When the lag $\theta$ to be measured lies outside the range $\theta 4$ to $\theta 5$ (FIG. 2) which is defined by this threshold comparison, the acquisition phase takes place as follows: the signal HR (FIG. 6a) from shaping circuit 31 is applied to a 1/K dividing circuit 35 which emits a pulse S10 (FIG. 6c) each time K pulses of HR are counted. Dividing circuit 35 may consist of a logic circuit or of a circuit which counts up to K associated with a circuit which counts down to K and which resets the counter to zero. Signal S10, after being inverted in an inverter circuit 36, is applied together with signal HR to an AND circuit 37 and the resulting signal S11 (FIG. 6d) corresponds to signal HR with one pulse in every K pulses suppressed. This signal is used to time the code generator 7, to which it is transmitted via AND circuit 38 and OR circuit 39. Each time this suppression of a pulse occurs, it results in a shift of the code by one bit. In the case of the example shown in FIG. 6f, the value of K is assumed to be equal to that N = 15 of the code. The progressive shift of the code is shown by comparison with FIG. 6g which represents the same repeated without shift. The result is that the auto-correlation function S5 is shifted along the lag axis and that the maximum range TC of measurement has been completely swept after N periods TC. As soon as the value $\theta$ to be measured enters the detection range $\theta 4$ to $\theta 5$, the sweep no longer operates as a result of the change in the value of the output of comparator 33. The comparison output signal, after being shaped in a trigger circuit 40, forms the signal S12 (FIG. 6b) and this, when applied to AND circuit 38, causes the synchronising signal S11 to cease being transmitted. Signal S12, after being inverted in an inverter circuit 41, is also applied together with signal HR to an AND circuit 42 whose output is connected to OR circuit 39 and thus causes the synchronising signal HR to be transmitted to code generator 7 so as to bring about automatic tracking and to cause the loop to lock on. Waveform 6e represents the successive synchronising signals at the output of OR circuit 39.

FIG. 7 represents an embodiment of the measuring circuit 11 in FIG. 1 and FIG. 8 wave forms relating to its operation. From the signals S6 (FIG. 8b) and S8 (FIG. 8g) resulting from the state decoding, two monostable circuits 50 and 51 produce short pulses S15 (FIG. 8c) and S18 (FIG. 8h) respectively, which are each intended to select a pulse of signal Hm (FIG. 8d) by means of two AND circuits 52 and 53. The time interval between the selected pulses S16 (FIG. 8e) and S19 (FIG. 8i) of Hm represents, with an accuracy of one period TE/m, the length of the delay $\theta$ to be measured. This measurement is made by counting the pulses of Hm in a counter 56 during this length of time by means of an AND circuit 55, which receives signal Hm and a signal S17 (FIG. 8f). Signal 17 is the output signal from a flip-flop circuit which is triggered by pulse S16 and reset to zero by pulse S19. The latter pulse also causes counter 56 to be reset to zero.

In the example which is described with reference to FIGS. 4 to 8, the modulation may be an amplitude, frequency or phase modulation and may be carried out in a coherent or non-coherent fashion with the modulation being adapted as the case may be. The modulated signal is amplified for transmission and the video reception signal which contains the code mingled with noise is amplified and processed by peak-clipping in a limiting amplifier before demodulation.

The tracking loop makes it possible to reconstitute a pseduo-random code which is synchronous with that of the demodulated signal and which is subject to a low signal-to-noise ratio.

Application to an electromagnetic detection system of the radio-electrical or optical (laser emission for example) type enables very accurate measurements to be made of the distance between two fixed or moving points, given that the unit of measurement is formed by a predetermined fraction 1/m of the bit length TE. The code is selected (the parameters being the number N and the bit width TE) on the basis of the size of the range of lags to be swept and of the accuracy required.

The acquistion phase may be brought about in a different way from the one described, for example by causing a continuous drift by means of open-loop operation, with the difference output S5 being applied to the threshold comparator device 33 and the voltage controlled oscillator 30 receiving at its input a fixed voltage VO via a switching device which is indicated at 60 in the partial diagram in FIG. 9. When the error signal S5 reaches the preset threshold level, its output causes switch 60 to change over and operation as an automatic tracking loop then takes place as before. The switch 60 may, for example, be formed by a field-effect transistor or a diode circuit.

The arrangement described enables very accurate measurements of lag to be made by selecting the parameter m and may advantageously be applied to optical or radio-electrical range-finding systems to measure the range of a moving target.

Of course the invention is not limited to the embodiment described and shown which was given solely by way of example.

What is claimed:

1. An arrangement for measuring the lag between two timed signals by electronic correlation, comprising: a first circuit for generating a numerical coded signal, means for transmitting the said coded signal through a transmission medium, means for receiving the coded signal after said transmission, a discriminator circuit of the type comprising two correlation circuits for correlating the coded signal received with respective ones of two reference coded signals reproducing said numerical code and relatively displaced in time in such a way that their respective auto-correlation functions partially overlap to form a common range of lag measurement, and a differential circuit for providing a signal representing the difference between the correlation outputs, a first synchronising circuit for synchronising with a first clock signal the said first generator circuit, a second generator circuit for producing the said two reference signals, a second synchronising circuit for synchronising the said second generator circuit using a synchronising signal whose frequency is locked to the amplitude of the said difference signal, and lag measuring means comprising two state-decoding circuits having inputs connected to the said generator circuits respectively and outputs connected to a measuring circuit, said state decoding circuits providing each a pulse signal, the time interval separating said pulse signals corresponding to the lag to be measured, the said first synchronising circuit providing a second clock signal for measurement purposes whose period is a sub-multiple of the period of said first clock signal to enable the said measuring circuit to count pulses.

2. A measuring arrangment according to claim 1, wherein the said generating circuits produce periodically a pseudo-random binary code, and the said synchronising circuit includes an oscillator circuit whose frequency is controlled by the said difference signal and whose centre frequency corresponds to that of the said first clock signal, with the extent of the said common range of correlation corresponding to the bit period of the said reference signals.

3. A measuring arrangement according to claim 2, wherein the said correlation comprise two multiplying circuits which both receive the said coded received signal but which receive respective ones of the said reference signals and which are connected by their outputs to the said differential circuit, and a filter circuit inserted between the latter and the said voltage controlled oscillator.

4. A measuring arrangement according to claim 3, wherein the said second synchronising circuit includes an acquisition circuit which receives the said difference signal and a pulse train provided from the output of the said voltage controlled oscillator, the output of the said acquisition circuit timing the said second generator circuit and the said acquisition circuit adjusting the difference in time between the said coded received signal and the said reference signals until the amplitude of the said difference signal reaches a predetermined threshold level at which the said frequency locking can become operative, the said acquisition circuit including comparison means for undertaking a threshold comparison on the said difference signal.

5. A measuring arrangement according to claim 4, wherein the said acquisition circuit includes a divide-by-K circuit and a set of AND and OR gate circuits to produce, during the acquisition phase, a synchronising signal which is formed by the said pulse train with one in every K pulses suppressed.

6. A measuring arrangement according to claim 4, wherein the said acquisition circuit includes a switch circuit to switch the input of the said voltage controlled oscillator to a predetermined fixed voltage (VO) during the acquisition phase.

7. A measuring arrangement according to claim 1, wherein the measuring circuit contains circuits to generate from the outputs of the said state-decoding circuits a square-wave pulse whose duration represents the lag to be measured, and a counting circuit which receives the said second clock signal while the said square-wave persists.

8. A range-finding system according to claim 1 wherein it includes means for transmitting the said coded signal by modulating a carrier wave and means for receiving and demodulating the corresponding received signals.

* * * * *